(12) United States Patent
Malakar et al.

(10) Patent No.: US 12,267,082 B2
(45) Date of Patent: Apr. 1, 2025

(54) FREQUENCY-REGULATED OSCILLATOR CIRCUIT

(71) Applicant: NXP USA, Inc., Austin, TX (US)

(72) Inventors: Pragya Priya Malakar, Chandler, AZ (US); John Pigott, Phoenix, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 18/459,289

(22) Filed: Aug. 31, 2023

(65) Prior Publication Data

US 2025/0080123 A1 Mar. 6, 2025

(51) Int. Cl.
*H03L 3/00* (2006.01)
*H03L 7/08* (2006.01)
*H03L 7/089* (2006.01)
*H03L 7/095* (2006.01)
*H03L 7/099* (2006.01)

(52) U.S. Cl.
CPC ............. *H03L 7/0991* (2013.01); *H03L 3/00* (2013.01); *H03L 7/0802* (2013.01); *H03L 7/0891* (2013.01); *H03L 7/095* (2013.01); *H03L 7/0995* (2013.01)

(58) Field of Classification Search
CPC ......... H03L 3/00; H03L 7/0802; H03L 7/087; H03L 7/089; H03L 7/0891; H03L 7/093; H03L 7/095
See application file for complete search history.

(56) References Cited

U.S. PATENT DOCUMENTS

| | | | |
|---|---|---|---|
| 5,579,353 A | 11/1996 | Parmenter et al. | |
| 5,686,864 A * | 11/1997 | Martin | H03L 7/103 327/107 |
| 6,670,834 B1 * | 12/2003 | Swanson | H03L 7/18 327/159 |
| 7,868,670 B2 * | 1/2011 | Becke | H03L 7/0891 327/159 |
| 8,358,159 B1 * | 1/2013 | Eker | H03L 7/095 327/156 |
| 8,422,615 B2 | 4/2013 | Den Besten | |
| 9,608,644 B1 * | 3/2017 | Raj | H03L 7/091 |
| 11,469,877 B1 * | 10/2022 | Raj | H04L 25/4917 |
| 2003/0038619 A1 * | 2/2003 | Boateng | H03L 7/18 324/76.53 |

(Continued)

OTHER PUBLICATIONS

Abidi, A. A., "Linearization of voltage-controlled oscillators using switched capacitor feedback," in€IEEE Journal of Solid-State Circuits, vol. 22, No. 3, pp. 494-496 (Jun. 1987).

(Continued)

*Primary Examiner* — Levi Gannon
(74) *Attorney, Agent, or Firm* — Andrew C. Milhollin

(57) ABSTRACT

Oscillator circuitry and methods of operation thereof are provided in which the oscillator circuitry includes at least a first oscillator, a second oscillator, and a lock detector. The first oscillator is configured to generate a first clock signal. The second oscillator is configured to generate a second clock signal. The lock detector is configured to detect a stable phase lock between the first clock signal and the second clock signal and to switch an output of the oscillator circuitry from the first clock signal to the second clock signal in response to detecting the stable phase lock.

20 Claims, 6 Drawing Sheets

(56) References Cited

U.S. PATENT DOCUMENTS

| | | | |
|---|---|---|---|
| 2003/0137328 A1* | 7/2003 | Kurd | H03L 7/099 327/156 |
| 2007/0090881 A1* | 4/2007 | Seefeldt | H03L 7/105 331/1 A |
| 2015/0061737 A1* | 3/2015 | Abbasi | H03L 7/1075 327/156 |
| 2015/0296452 A1 | 10/2015 | Hu et al. | |

OTHER PUBLICATIONS

Ding, Xin et al.; "A Fast Settling Frequency-to-Voltage Converter with Separate Voltage Tracing Technique for FLLs"; 18th International Conference on Electrical Engineering/Electronics, Computer, Telecommunications and Information Technology; 4 pages (2021).

Dong, Zhicheng et al.; "A 0.012mm2 36.41kHz Temperature-Insensitive Current-Reuse Ring Oscillator Achieving 0.077%/V Line Sensitivity across a 1.3V-to-3.7V Unregulated Supply"; 2023 IEEE Custom Integrated Circuits Conference; 2 pages (2023).

Truesdell, Daniel et al.; "A 0.6-V 44.6-fJ/Cycle Energy-Optimized Frequency-Locked Loop in 65-nm CMOS With 20.3-ppm/° C. Stability"; IEEE Solid-State Circuit Letters, vol. 2, No. 10; 4 pages (Oct. 2019).

Wakayama, M. H. et al., "A 30-MHz low-jitter high-linearity CMOS voltage-controlled oscillator," in€IEEE Journal of Solid-State Circuits, vol. 22, No. 6, pp. 1074-1081, (Dec. 1987).

Zamboki, Andro et al.; "Low-Power Frequency-Locked Loop Circuit with Short Settling Time"; MIPRO 2022, Opatija, Croatia, 6 pages (May 23-27, 2022).

Gutierrez Get Al: 11 2.488 Gb/s Silicon Bipolar Clock and Data Recovery IC for Sonet (OC-48), Proceedings of the IEEE 1998 Custom Gutierrez Get Al: 11 2.488 GB/S Silicon Bipolar Clock and Data Recovery IC for Sonet (OC-48), Proceedings of the IEEE 1998 Custom [Annual Custom Integrated Circuits Conference], New York, NY : IEEE, US, vol. CONF. 20, May 11, 1998, pp. 575-578.

* cited by examiner

FREQUENCY-REGULATED OSCILLATOR CIRCUIT

TECHNICAL FIELD

Embodiments of the subject matter described herein relate generally to integrated circuits, including frequency-regulated oscillator circuits such as frequency locked loop (FLL) oscillator circuits.

BACKGROUND

Oscillators are widely used in electronic devices as clock generators for the production of clock signals that are, in turn, used to generate various control signals and timing references. For example, voltage-controlled oscillators (VCOs) are commonly used in closed-loop synchronization circuits, such as frequency locked loops (FLLs). Conventional VCO-based FLLs can have high accuracy (once stabilized) and relatively low current consumption but tend to have extremely inaccurate oscillation frequencies at start-up and tend to have slow start-up (e.g., up to around 100 μs). The slow start-up time of conventional implementations of VCO-based FLLs may cause them to be unsuitable for applications that require oscillation circuitry with comparatively faster start-up times.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, oscillator circuitry includes a first oscillator configured to generate a first clock signal, a second oscillator configured to generate a second clock signal, and a lock detector configured to detect a stable phase lock between the first clock signal and the second clock signal and switch an output of the oscillator circuitry from the first clock signal to the second clock signal in response to detecting the stable phase lock.

In one or more embodiments, the oscillator circuitry further includes a phase-locked loop (PLL) that includes the first oscillator, the second oscillator, a phase frequency detector configured to receive the first clock signal and the second clock signal, detect edges of the first clock signal and the second clock signal, assert a first signal in response to detecting an edge of the first clock signal, assert a second signal in response to detecting an edge of the second clock signal, and reset the first signal and the second signal in response to determining that the first signal and the second signal are simultaneously asserted, and a charge pump configured to modify a control signal received by the second oscillator based on the first signal and the second signal.

In one or more embodiments, the oscillator circuitry further includes a frequency-locked loop that includes the second oscillator, a frequency-to-voltage circuit configured to receive the second clock signal and generate a voltage based on a frequency of the second clock signal, and an operational amplifier configured to receive the voltage and a reference voltage from the frequency-to-voltage circuit, compare the voltage and the reference voltage, and modify the control signal based on a result of comparing the voltage and the reference voltage.

In one or more embodiments, the lock detector is configured to assert a lock signal in response to detecting the stable phase lock.

In one or more embodiments, a first output of the frequency-to-voltage circuit is shorted to a second output of the frequency-to-voltage circuit in response to the lock signal not being asserted.

In one or more embodiments, the oscillator circuitry further includes a multiplexer configured to receive the first clock signal, the second clock signal, and the lock signal. The multiplexer may be configured to output the first clock signal in response to the lock signal not being asserted and output the second clock signal in response to the lock signal being asserted.

In one or more embodiments, the lock detector is configured to receive the first signal and the second signal from the phase frequency detector, and detect the stable phase lock based on the first signal and the second signal.

In one or more embodiments, the lock detector includes logic circuitry configured to generate a reset signal based on the first signal and the second signal, and counter circuitry configured to increment a counter at each cycle of the first clock signal until reset by the reset signal or until the counter reaches a predetermined count value, and assert the lock signal in response to the counter reaching the predetermined count value.

In one or more embodiments, assertion of the lock signal disables any of the first oscillator, the phase frequency detector, the charge pump, and the lock detector.

In one or more embodiments, the oscillator circuitry further includes a compensation capacitor coupled to an input of the second oscillator at which the control signal is received. A voltage at the compensation capacitor may be the control signal.

In one or more embodiments, the oscillator circuitry may further include a voltage buffer coupled to an output of the charge pump, where the output of the charge pump is coupled to the input of the second oscillator, and an additional compensation capacitor coupled to the voltage buffer. A voltage at the additional compensation capacitor may be the control voltage while the PLL is active.

In an example embodiment, a method of operating oscillator circuitry may include generating, by a first oscillator of the oscillator circuitry, a first clock signal, generating, by a second oscillator of the oscillator circuitry, a second clock signal, detecting, by a lock detector, a stable phase lock between the first clock signal and the second clock signal, and switching an output of the oscillator circuitry from the first clock signal to the second clock signal in response to detecting the stable phase lock.

In one or more embodiments, the first oscillator has a start-up time of less than 1 nanosecond and the second oscillator has a start-up time of more than 5 microseconds.

In one or more embodiments, the method further includes receiving, by a phase frequency detector of the oscillator circuitry, the first clock signal and the second clock signal, detecting, by the phase frequency detector, edges of the first clock signal and the second clock signal, asserting, by the phase frequency detector, a first signal in response to detecting an edge of the first clock signal, asserting, by the phase frequency detector, a second signal in response to detecting an edge of the second clock signal, resetting, by the phase frequency detector, the first signal and the second signal in response to determining that the first signal and the second signal are simultaneously asserted, and modifying, by a charge pump of the oscillator circuitry, a control signal received by the second oscillator based on the first signal and the second signal.

In one or more embodiments, the method further includes receiving, by a frequency-to-voltage circuit of the oscillator circuitry, the second clock signal, generating, by the frequency-to-voltage circuit, a voltage based on the frequency of the second clock signal, receiving, by an operational amplifier of the oscillator circuitry, the voltage and a reference voltage from the frequency-to-voltage circuit, comparing, by the operational amplifier, the voltage and the reference voltage, and modifying, by the operational amplifier, the control signal based on a result of comparing the voltage and the reference voltage.

In one or more embodiments, the method further includes asserting, by the lock detector, a lock signal in response to detecting the stable phase lock, outputting, by the oscillator circuitry, the first clock signal in response to the lock signal not being asserted, and outputting, by the oscillator circuitry, the second clock signal in response to the lock signal being asserted.

In one or more embodiments, the method further includes shorting a first output of the frequency-to-voltage circuit to a second output of the frequency-to-voltage circuit in response to the lock signal not being asserted.

In one or more embodiments, the method further includes receiving, by the lock detector, the first signal and the second signal from the phase frequency detector, and detecting, by the lock detector, the stable phase lock based on the first signal and the second signal.

In one or more embodiments, the method further includes periodically changing, by counter circuitry of the lock detector, a value of a counter in response to the stable phase lock, and asserting, by the lock detector, the lock signal in response to the counter of the counter circuitry reaching a predetermined count value.

In one or more embodiments, the method further includes disabling any of the first oscillator, the phase frequency detector, the charge pump, and the lock detector in response to assertion of the lock signal.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
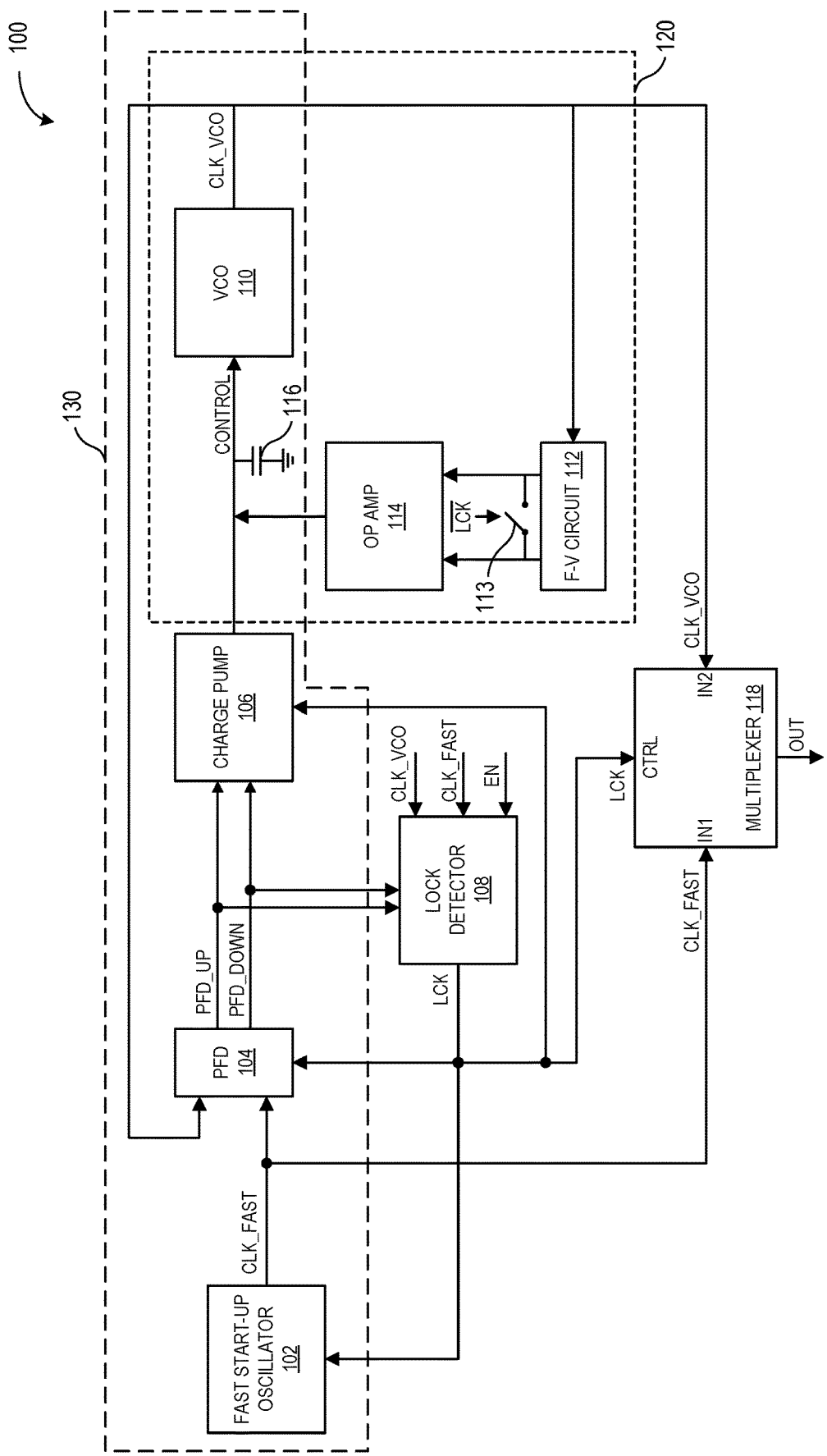
FIG. 1 is a block diagram illustrating example oscillator circuitry that includes a voltage-controlled oscillator (VCO), a fast start-up oscillator, and a lock detector configured to determine whether the clock signals of the VCO and the fast start-up oscillator are substantially in phase, and to select one of those clock signals for output by the oscillator circuitry based on that determination, in accordance with one or more embodiments.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted for sake of brevity. Additionally, elements in the drawing figures are not necessarily drawn to scale. For example, the dimensions of some of the elements or regions in the figures may be exaggerated relative to other elements or regions to help improve understanding of embodiments described herein.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein relate to oscillator circuitry that includes a fast start-up oscillator included in a phase-locked loop (PLL) and a voltage-controlled oscillator (VCO) included in both the PLL and a frequency-locked loop (FLL). In accordance with various embodiments, either or both of the fast start-up oscillator and the VCO may be relaxation oscillators. The oscillator circuitry is configured to output an oscillating signal (e.g., clock signal) generated by the fast start-up oscillator upon turning on the oscillator circuitry (i.e., at "start-up" of the oscillator circuitry), and to then switch the output to another oscillating signal (e.g., clock signal) generated by the VCO once oscillation of the PLL is determined to have stabilized, in response to which the PLL is disabled. The VCO may be a frequency-regulated oscillator, at least in that it may be included in the FLL. In one or more embodiments, stabilization of the VCO is determined by the oscillation circuitry in response to detection of a stable phase lock between the clock signals of the VCO and the fast start-up oscillator.

In one or more embodiments, a lock detector may be included in the oscillator circuitry, where the lock detector is configured to detect a stable phase lock between the clock signals of the VCO and the fast start-up oscillator based at least in part on the outputs of a phase-frequency detector (PFD). The PFD may receive and monitor the fast start-up and VCO clock signals and generate PFD output signals (PFD_UP and PFD_DOWN) in response to detected edges (e.g., either rising edges or falling edges in accordance with various embodiments) of these clock signals. In one or more embodiments, once detected edges of both signals are sufficiently close (e.g., with detected edges of both clock signals occurring within around 4 ns of one another), temporally, logic circuitry in the lock detector may consider them to be "in phase" or "phase locked".

In one or more embodiments, to avoid false positives when attempting to detect phase lock between the fast start-up and VCO clock signals, the lock detector circuitry may include a counter circuit that is clocked by the fast start-up clock signal CLK_FAST of the fast start-up oscillator and that is configured to increment its count while the PFD output signal indicates a detected phase lock between the fast start-up and VCO clock signals. Otherwise, the counter is reset. When the counter runs uninterrupted for a sufficiently long time period (indicating that the monitored clock signals have remained in phase during that period, such that the phase lock may be considered "stable"), it reaches or exceeds a predetermined count value (in some instances resulting in an overflow of the counter), causing the counter to assert counter output signal. The lock detector may assert (e.g., set high) a lock signal LCK in response to assertion of the counter output signal. In one or more embodiments, upon assertion of the counter output signal by the counter, the lock detector may be configured to delay assertion of the lock signal LCK until a rising or falling edge of the VCO clock signal CLK_VCO is detected. Herein, a signal is referred to as "high" when it is at a high logic level, which may correspond to a signal voltage at or around 1.5 V (e.g., within a tolerance such as +/−10%), and is referred to as "low" when it is at a low logic level, which may correspond to a signal voltage at or around 0 V (e.g., within a tolerance such as +/−0.1 V).

Upon detection of a stable phase lock, the lock detector provides the asserted lock signal LCK to a control input of a multiplexer and to one or more of the fast start-up oscillator, the PFD, a charge pump, and logic circuitry of the lock detector. When asserted (indicating a stable phase lock and, effectively, that oscillation of the VCO is stable), the lock signal LCK disables the fast start-up oscillator, the PFD, the charge pump, and the lock detector to reduce or eliminate power consumption by these components during subsequent operation of the oscillator circuitry. When asserted, the lock signal LCK further causes the multiplexer 118 to switch its output (which is also the output of the oscillator circuitry) from the fast start-up clock signal CLK_FAST to the VCO clock signal CLK_VCO. Herein, assertion of a signal may refer to changing the voltage level of that signal from one logic level to another (e.g., from low to high).

FIG. 1 shows oscillator circuitry 100 that is configured to accommodate the relatively slow start-up time of a frequency-regulated voltage-controlled oscillator (VCO) by initially setting the clock signal of a fast start-up oscillator as its output, then switching its output to the clock signal generated by the VCO once the VCO clock signal has had time to stabilize (e.g., in response to detecting a stable phase lock between the clock signals of the VCO and the fast start-up oscillator). As shown, the oscillator circuitry 100 may include a fast start-up oscillator 102, a phase frequency detector 104, a charge pump 106, a lock detector 108, a voltage-controlled oscillator (VCO) 110, a frequency-to-voltage (F-V) circuit 112, an operational amplifier 114, a compensation capacitor 116, and a multiplexer 118. The oscillator circuitry 100 may be configured to provide an output signal OUT that is initially set to a clock signal CLK_FAST produced by the fast start-up oscillator at start-up of the oscillator circuitry. The output signal OUT is later switched to a clock signal CLK_VCO, produced by the VCO 110, once oscillation of the VCO 110 is determined to have stabilized (e.g., reached steady state). In one or more embodiments, oscillation stabilization of the VCO 110 may be determined by the lock detector 108 based on whether the clock signals CLK_VCO and CLK_FAST are consistently in-phase throughout a time period of predetermined length (i.e., an example of a "stable phase lock").

The fast start-up oscillator 102 may be a relaxation oscillator with at least medium accuracy and a faster start-up time than that of the VCO 110. Herein, a "relaxation oscillator" generally refers to any non-linear electronic oscillator circuit configured to produce a repeating non-sinusoidal output signal, such as a repeating sequence of square waves, triangle waves, or other non-sinusoidal signals. Herein, the "start-up time" of an oscillator refers to the amount of time required, from initial activation, for the oscillator to reach a steady, non-transient state. Herein, an oscillator with "medium accuracy" may generate an oscillating signal at a frequency that stays within at least +/−25% of a target frequency at steady state. In one or more embodiments, the target frequency may be in a range of between 16 MHz to around 24 MHZ. The fast start-up oscillator 102 is configured to generate a fast start-up clock signal CLK_FAST, which the fast start-up oscillator 102 provides to inputs of the PFD 104 and the multiplexer 118.

When operating as part of the FLL 120, the VCO 110 may have high accuracy and a slower start-up time than the fast start-up oscillator 102. Herein, an oscillator with "high accuracy" may generate an oscillating signal at a frequency that is within at least +/−3% of a target frequency at steady state. The VCO 110 is configured to generate a VCO clock signal CLK_VCO, which the VCO 110 provides to inputs of the PFD 104, the F-V circuit 112, and the multiplexer 118.

In one or more embodiments, the fast start-up oscillator 102 may have a start-up time of between around 1 ns to around 50 ns (e.g., a start-up time of around one clock cycle of a target frequency of the fast start-up oscillator 102) and the FLL 120 may have a start-up time of between around 5 µs and around 100 µs. Herein, a value is considered to be "around" or "approximately" equal to another value if it is within +/−50% of that value, unless otherwise indicated.

The fast start-up oscillator 102, the PFD 104, the charge pump 106, the compensation capacitor 116, and the VCO 110 may be arranged to form a phase-locked loop (PLL) 130. In the PLL 130, the fast start-up clock CLK_FAST generated by the fast start-up oscillator 102 may act as a reference to which the VCO clock signal CLK_VCO is compared by the PFD 104. For example, the PFD 104 may receive the clock signals CLK_FAST and CLK_VCO from the fast start-up oscillator 102 and the VCO 110, respectively. The PFD 104 is configured to detect edges (e.g., rising edges or falling edges) of the clock signals CLK_FAST and CLK_VCO and to generate PFD signals PFD_UP and PFD_DOWN in response. As a non-limiting example, the PFD 104 may be configured to set the PFD signal PFD_DOWN high in response to detecting a rising or leading edge of the clock signal CLK_VCO, to set the PFD signal PFD_UP high in response to detecting a rising or leading edge of the clock signal CLK_FAST, and to reset the PFD signals PFD_UP and PFD_DOWN to low in response to determining that both PFD signals are high. The PFD 104 may provide the PFD signals PFD_UP and PFD_DOWN to inputs of the charge pump 106 and the lock detector 108.

In one or more embodiments, the PLL 130 may be configured to operate in one of three states based on the respective logic levels of the PFD signals PFD_UP and PFD_DOWN received from the PFD 104. In a first state in which PFD_UP is low and PFD_DOWN is high, the charge pump 106 is configured to provide an electric current with a first polarity (e.g., negative) at its output, thereby modifying (e.g., decreasing) the voltage magnitude of the control signal CONTROL provided to the input of the VCO 110. In a second state in which PFD_UP is high and PFD_DOWN is low, the charge pump 106 is configured to provide an electric current with a second polarity (e.g., positive) at its output, thereby modifying (e.g., increasing) the voltage magnitude of the control signal CONTROL. In a third state in which PFD_UP is low and PFD_DOWN is low, the charge pump 106 is configured to output little or no electric current, such that the charge pump 106 does not significantly modify the voltage magnitude of the control signal CONTROL. In response to detecting that signals PFD_UP and PFD_DOWN are both high, the PFD 104 triggers a reset, causing both PFD_UP and PFD_DOWN to be reset to low and returning the charge pump 106 to the third state. In one or more embodiments, the VCO 110 may be configured such that an increase in the voltage of the control signal CONTROL results in an increase of the frequency of CLK_VCO and a decrease in the voltage of the control signal CONTROL results in a decrease of the frequency of CLK_VCO.

Continuing the example, if the PFD 104 detects the edge (e.g., falling or rising) of the clock signal CLK_FAST before that of the clock signal CLK_VCO (i.e., CLK_VCO is lagging CLK_FAST), the PFD 104 will set PFD_UP high while PFD_DOWN is low during the time period between the detection of the CLK_FAST edge and detection of the corresponding CLK_VCO edge, causing the charge pump 106 to modify the control signal CONTROL (achieved at least in part by charging or discharging the compensation capacitor 116) to cause the VCO 110 to increase the frequency of the clock signal CLK_VCO. Conversely, if the PFD 104 detects the edge (e.g., falling or rising) of the clock signal CLK_VCO before that of the clock signal CLK_FAST (i.e., CLK_FAST is lagging CLK_VCO), the PFD 104 will set PFD_DOWN high while PFD_UP is low during the time period between the detection of the CLK_VCO edge and detection of the corresponding CLK_FAST edge, causing the charge pump 106 to modify the control signal CONTROL (achieved at least in part by charging or discharging the compensation capacitor 116) to cause the VCO 110 to decrease the frequency of the clock signal CLK_VCO. Once the clock signals CLK_FAST and CLK_VCO are aligned with respect to both phase and frequency, the detected edges of these signals will be substantially aligned, such that the PFD 104 will consistently set PFD_UP high and PFD_DOWN high at or near the same time such that the charge pump 106 does not modify the control signal CONTROL, indicating that a phase lock between the clock signals CLK_FAST and CLK_VCO has been achieved. It should be understood that this example is intended to be illustrative and non-limiting. In one or more other embodiments, other suitable phase detection (e.g., using an XOR phase detector) techniques may be used as a basis for adjusting the control signal CONTROL based on phase comparison between the clock signals CLK_VCO and CLK_FAST.

The lock detector 108 may be configured to determine, by monitoring the PFD output signals PFD_UP and PFD_DOWN, whether a stable phase lock has been achieved between the clock signals CLK_VCO and CLK_FAST. The lock detector 108 may be configured to generate a lock signal LCK, which the lock detector 108 is configured to assert (e.g., set high) in response to detecting a stable phase lock between the clock signals CLK_VCO and CLK_FAST. In one or more embodiments, the lock detector 108 may be configured output the lock signal LCK to the fast start-up oscillator 102, the PFD 104, the charge pump 106, and the control input of the multiplexer 118. Assertion of the lock signal LCK by the lock detector 108 may cause the fast start-up oscillator 102, the PFD 104, the charge pump 106, the lock detector 108 to be disabled (effectively disabling the PLL 130), either by turning off these elements or by removing inputs from these elements that would otherwise cause the elements to consume power. Assertion of the lock signal CLK by the lock detector 108 may further cause the multiplexer 118 to switch the output signal OUT from the clock signal CLK_FAST to the clock signal CLK_VCO, where the clock signal CLK_VCO, once stabilized, may have better precision and accuracy than the clock signal CLK_FAST.

Figure 2:
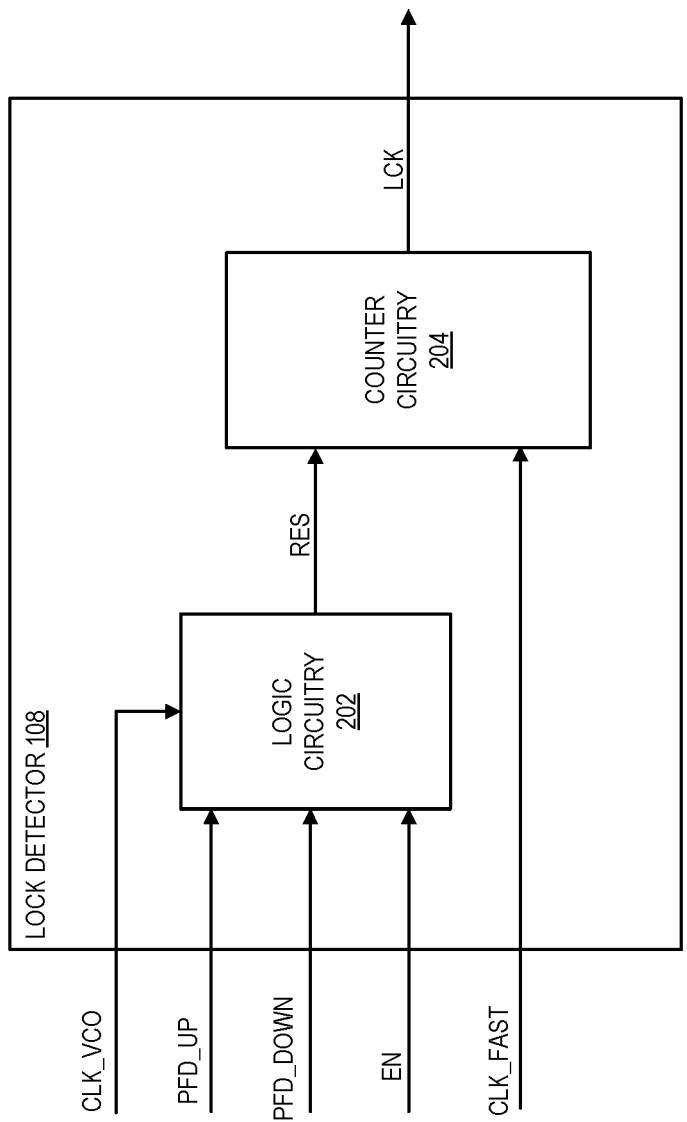
FIG. 2 is a block diagram illustrating a lock detector, such as the lock detector of FIG. 1, in accordance with one or more embodiments.

FIG. 2 shows an example embodiment of the lock detector 108 in which the lock detector 108 uses a counter-based approach to detect a stable phase lock. For example, the lock detector 108 may include logic circuitry 202 and counter circuitry 204. The logic circuitry 202 may receive PFD output signals PFD_UP and PFD_DOWN (e.g., from the PFD 104 of FIG. 1). The logic circuitry may generate a reset signal RES, which the logic circuitry 202 may provide to a reset input of the counter circuitry 204. For example, the counter circuitry 204 may be reset when the reset signal RES is high. In one or more embodiments, the logic circuitry 202 includes at least an OR logic gate that receives the PFD_UP and PFD_DOWN signals, and the generation of the reset signal RES is dependent on the output of this OR logic gate.

In one or more embodiments, the logic circuitry 202 is configured to assert (e.g., set high) the reset signal RES when one of the signals PFD_UP and PFD_DOWN is high while the other is low for a sufficiently long period (e.g., longer than around 1 ns or around 5 ns in accordance with various embodiments). As the differences between the phases and frequencies of the clock signals CLK_VCO and CLK_FAST decreases, the period during which one of the signals PFD_UP and PFD_DOWN is high while the other is low becomes increasingly short, eventually causing the logic circuitry 202 to stop asserting the reset signal RES (e.g., when the phase difference is less than around 5 ns), at which point the counter circuitry may be allowed to run (i.e., count) without being reset. The counter circuitry 204, when not reset, may increment or decrement (in accordance with various embodiments) its count at each cycle of the clock signal CLK_FAST until it reaches a predetermined count value. In response to the counter reaching the predetermined count value, the counter circuitry 204 may assert a counter output signal. The counter circuitry 204 may assert the lock signal LCK in response to assertion of the counter output signal. In one or more embodiments, the counter circuitry 204 may delay asserting the lock signal LCK after assertion of the counter output signal until the clock signal CLK_VCO is high at the same time as the counter output signal. The counter circuitry 204 may include a 5-bit counter, as a non-limiting example.

Using the counter circuitry 204 to assert the lock signal LCK in this way may improve the likelihood that a detected phase lock between the clock signals CLK_VCO and CLK_FAST has stabilized before asserting the lock signal LCK (e.g., to switch the output of the oscillator circuitry 100 to CLK_VCO and disable the PLL 130 of FIG. 1).

Returning to FIG. 1, the VCO 110, the F-V circuit 112, the operational amplifier 114, and the compensation capacitor 116 may be arranged to form a frequency-locked loop (FLL) 120. For example, the F-V circuit 112 may receive the clock signal CLK_VCO from the VCO 110 and may be configured to generate a frequency-dependent voltage based on the clock signal CLK_VCO. The F-V circuit 112 may output this frequency-dependent voltage and a separate reference voltage (corresponding to a target frequency of the VCO 110 and the clock signal CLK_VCO) to the inverting and non-inverting inputs of the operational amplifier 114.

The operational amplifier 114 may receive and compare the frequency-dependent voltage and the reference voltage from the F-V circuit 112. In one or more embodiments, the operational amplifier 114 may be an operational transconductance amplifier. The operational amplifier 114 may generate an output signal based on the results of this comparison, with the current of the output signal being dependent on the difference in voltage level between the frequency-dependent voltage and the reference voltage. In one or more embodiments, the value of the frequency-dependent voltage may have an inverse relationship with the frequency of the clock signal CLK_VCO, such a higher frequency of CLK_VCO results in a lower frequency-dependent voltage, and vice-versa. For example, the operational amplifier 114 may generate an output signal having a current that modifies the voltage of the control signal CONTROL to cause the VCO 110 to increase the frequency of the clock signal CLK_VCO in response to the frequency-dependent voltage being greater than the reference voltage. The operational amplifier 114 may generate an output signal having a current that modifies the voltage of the control signal CONTROL to cause the VCO 110 to decrease the frequency of the clock signal CLK_VCO in response to the frequency-dependent voltage being less than the reference voltage. The operational amplifier 114 may make insignificant or no modification to the control signal CONTROL in response to the frequency-dependent voltage being at or around the same value as the reference voltage.

In one or more embodiments, a switch 113 may be coupled between the outputs of the F-V circuit 112. The switch 113 may be controlled by an inverted lock signal LCK (i.e., an inverted version of the lock signal LCK output by the lock detector 108) such that the switch 113 shorts the output paths of the F-V circuit 112 together when the lock signal LCK is not asserted. Shorting the output paths of the F-V circuit 112 together prior to detecting a stable phase lock in this way may prevent minor non-idealities (e.g., offset voltage effects) in the operational amplifier 114 from significantly affecting the control signal CONTROL while the PLL 130 is still attempting to achieve a stable phase lock between the clock signals CLK_VCO and CLK_FAST. Additionally, this arrangement ensures that the FLL 120 is pre-biased similarly to target operating bias levels (i.e., where the voltage output by the F-V circuit 112 based on the clock signal CLK_VCO is similar in magnitude to the reference voltage output by the F-V circuit once CLK_VCO settles at or near its target frequency). It should be understood that such an arrangement is intended to be illustrative and non-limiting, and that other techniques may instead be used to mitigate interference between the output of the operational amplifier 114 and the charge pump 106 prior to assertion of the lock signal LCK.

The compensation capacitor 116 may have a first terminal that is coupled to a node disposed between an input of the VCO 110 and outputs of the operational amplifier 14 and the charge pump 106 and may have a second terminal that is coupled to a ground or reference node. That is, the first terminal of the compensation capacitor may be connected to each of the charge pump 106, the VCO 110, and the operational amplifier 114. The capacitance of the compensation capacitor 116 may be set to a value that ensures stable slewing of the VCO 110.

In one or more embodiments, the compensation capacitor 116 may provide compensation for each of the FLL 120 and the PLL 130. In this way, a smooth, phase-coherent crossover is ensured when switching the output of the oscillator circuitry 100 from the fast start-up clock signal CLK_FAST to the VCO clock signal CLK_VCO because, at the time of PLL lock being achieved, the state (voltage) stored on the compensation capacitor 116 represents the control voltage level required to make the VCO output a signal having a frequency equal to the PLL reference (e.g., equal to the frequency of the clock signal CLK_FAST).

Figure 3:
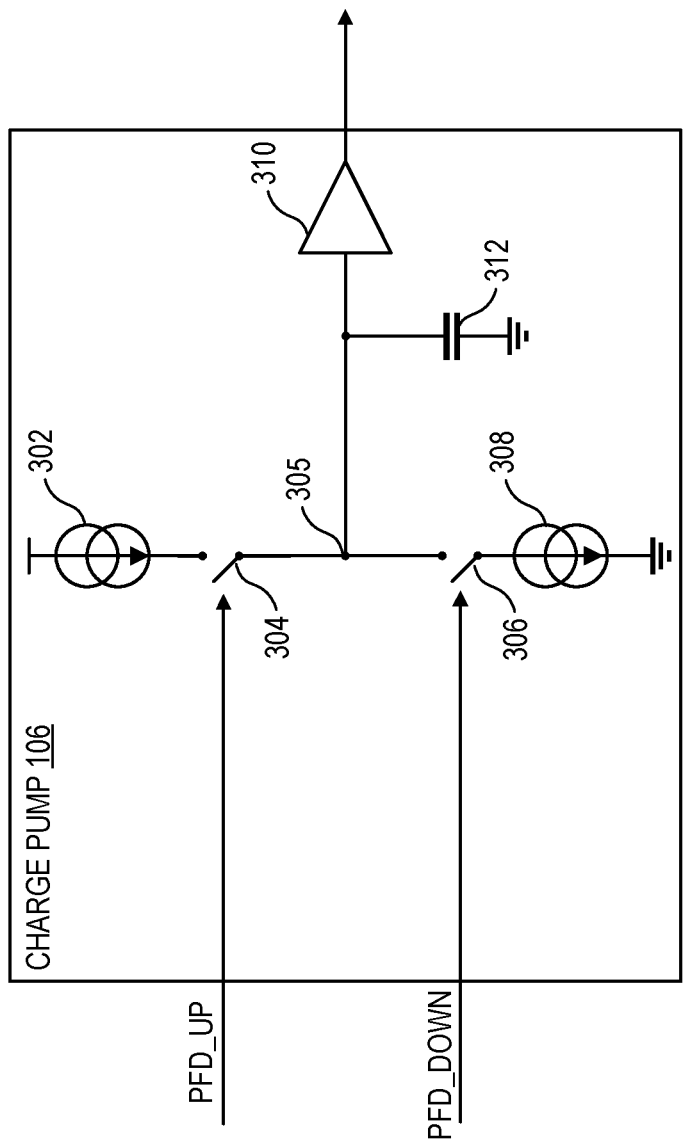
FIG. 3 is a block diagram illustrating a charge pump, such as the charge pump of FIG. 1, in accordance with one or more embodiments.

In one or more other embodiments, the compensation capacitor 116 may instead provide compensation for only the FLL 120, and the charge pump 106 may include a separate compensation capacitor configured to provide compensation for the PLL 130. FIG. 3 shows an example of such an arrangement in which the charge pump 106 includes a compensation capacitor 312 that provides compensation for the PLL 130 (separate from the compensation capacitor 116). The example of FIG. 3 is described here with reference to elements of the oscillator circuitry 100 of FIG. 1.

As shown, the charge pump 106 receives the PFD signals PFD_UP and PFD_DOWN from the PFD 104, which selectively control switches 304 and 306, respectively, to selectively and independently couple current sources 302 and 308 to a node 305. The node 305 is coupled to the output of the charge pump 106 via a voltage buffer 310. The compensation capacitor 312 is coupled between the node 305 and a ground or reference node. The compensation capacitor 312 may store a state (voltage) for the PLL 130, which may, via the voltage buffer 310, set the control voltage CONTROL that is provided to the input of the VCO 110. The arrangement of the voltage buffer 310 may ensure that the voltage stored at the compensation capacitor 312 overrides the output of the operational amplifier 114, which may advantageously mitigate interference from the FFL 120 that could otherwise potentially prevent the PLL 130 from achieving a stable phase lock.

Returning to FIG. 1, the multiplexer 118 may include a control input CTRL coupled to receive the lock signal LCK from the lock detector 108, a first selectable signal input IN1 coupled to receive the fast start-up clock signal CLK_FAST from the fast start-up oscillator 102, a second selectable signal input IN2 coupled to receive the VCO clock signal CLK_VCO from the VCO 110, and an output. The multiplexer 118 is configured to select one of the clock signals CLK_FAST and CLK_VCO to be output as an output signal OUT based on the value of the lock signal LCK. For example, when the lock signal LCK is asserted (i.e., set high), the multiplexer 118 may be configured to output the VCO clock signal CLK_VCO as the output signal OUT. When the lock signal LCK is deasserted (i.e., set low), the multiplexer 118 may be configured to output the fast start-up clock signal CLK_FAST as the output signal OUT.

Figure 4:
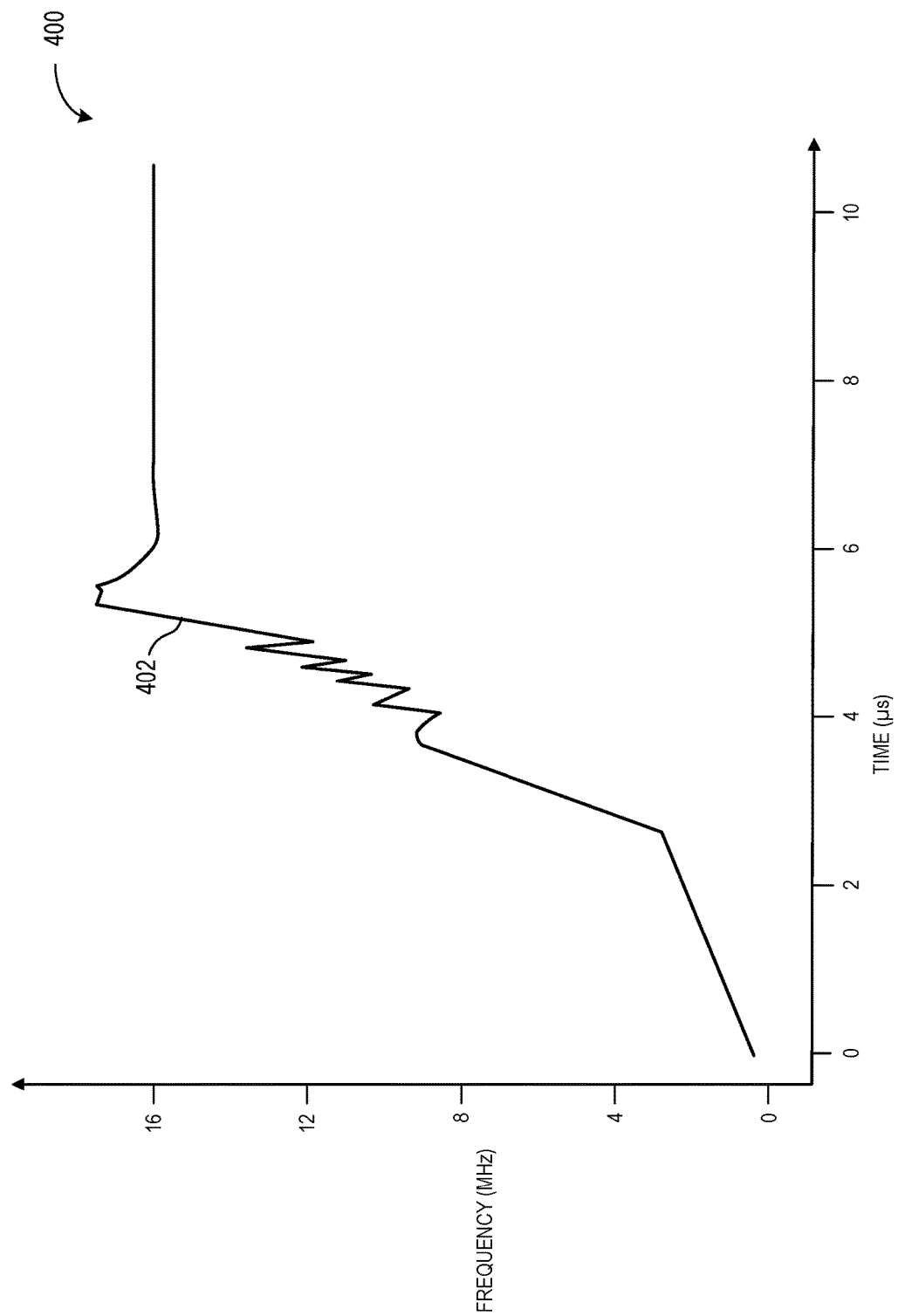
FIG. 4 is a graph illustrating frequency over time for a clock signal generated by a VCO, such as the VCO of FIG. 1, in a phase-locked loop (PLL), in accordance with one or more embodiments.

FIG. 4 shows a chart 400 illustrating a curve 402 that represents an example embodiment of the VCO clock signal CLK_VCO that may be generated by the VCO 110 of FIG. 1. For ease of illustration, the chart 400 is described with reference to elements of the oscillator circuitry 100 of FIG. 1.

In the present example, the clock signal CLK_VCO represented by the curve 402 may have a target frequency of around 16 MHZ. At start-up, however, the frequency of the clock signal is not at this target frequency and is considered inaccurate. As illustrated by the curve 402, the clock signal CLK_VCO eventually stabilizes to a frequency of about 16 MHz after about 7 μs. In various applications, including some DC-DC converter applications, a 7 μs delay in start-up is considered unacceptable. The VCO 110, if configured to generate the clock signal CLK_VCO represented by the curve 402, would, therefore, be unsuitable for use in such applications if provided in isolation (e.g., without the fast start-up oscillator 102 and related circuitry). However, the oscillator circuitry 100 compensates for the delayed stabilization of the VCO clock signal CLK_VCO by utilizing a less accurate but more quickly stabilized fast start-up clock signal CLK_FAST generated by the fast start-up oscillator 102 upon start-up of the oscillator circuitry, until it is determined (e.g., by the lock detector 108) that the VCO clock signal CLK_VCO has stabilized.

Figure 5:
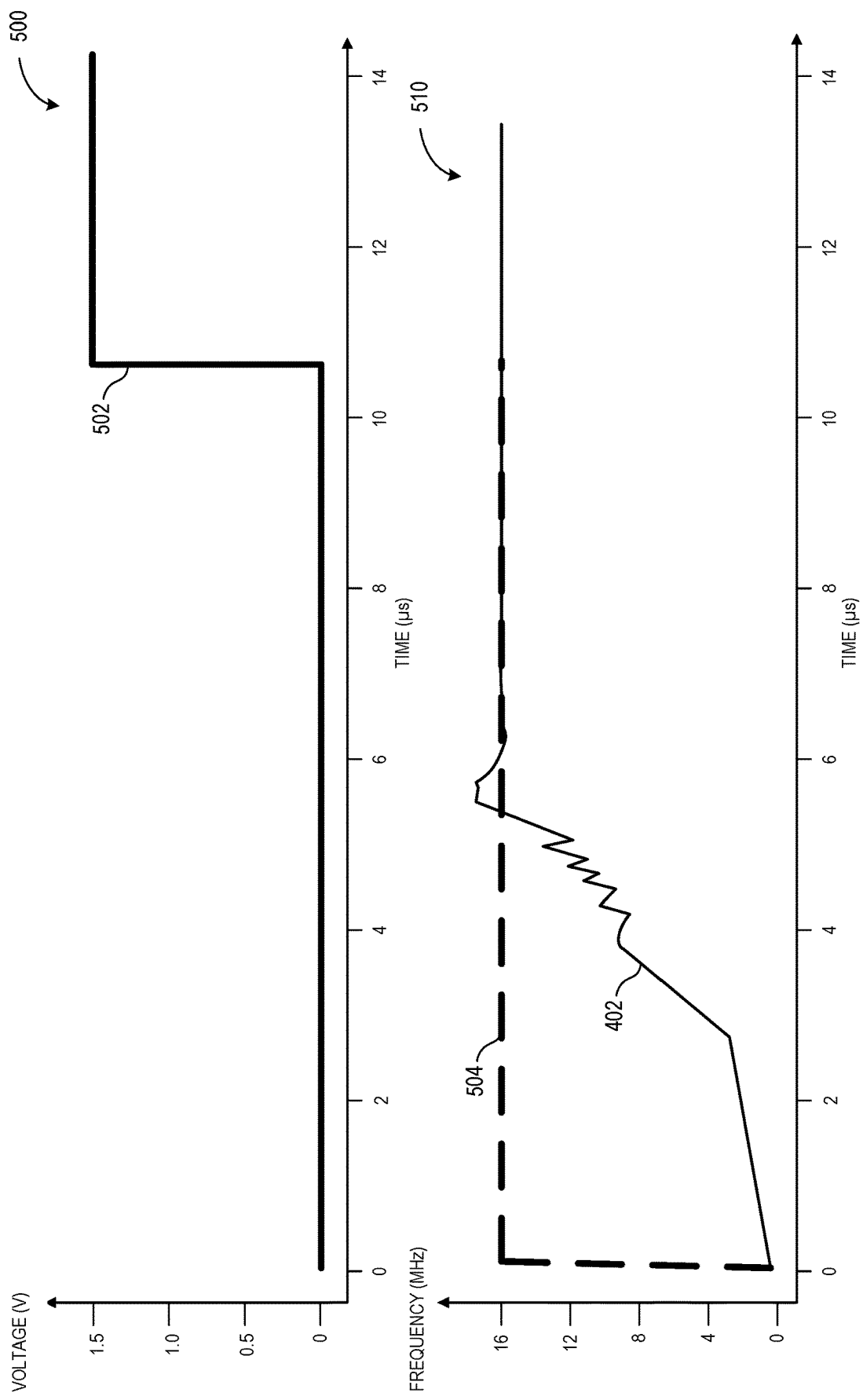
FIG. 5 is a set of graphs that includes a first graph illustrating voltage over time for a lock signal that may be generated by a lock detector such as that of FIGS. 1 and 2, and a second graph illustrating frequency over time for the clock signal of FIG. 4 and a fast start-up clock signal generated by a fast start-up oscillator, such as the fast start-up oscillator of FIG. 1, in accordance with one or more embodiments.

FIG. 5 shows charts 500 and 510, where the chart 500 illustrates a curve 502 representing an example embodiment of the lock signal LCK generated by the lock detector 108 of FIG. 1, and the chart 510 illustrates the curve 402 of FIG. 4, representing an example embodiment of the VCO clock signal CLK_VCO overlaid with a curve 504, representing an example embodiment of the fast start-up clock signal CLK_FAST generated by the fast start-up oscillator 102 of FIG. 1. For ease of illustration, the charts 500 and 510 are described with reference to elements of the oscillator circuitry 100 of FIG. 1. In the present example, the charts 500 and 510 show the same time period and use the same time scale.

In the present example, the oscillator circuitry 100 may output the fast start-up clock signal CLK_FAST from 0 μs to around 10.5 μs. At around 10.5 μs, the lock signal LCK is asserted by the lock detector 108 (e.g., in response to counter output signal being asserted by the counter of the lock detector 108, indicating a stable phase lock between clock signals CLK_FAST and CLK_VCO), such that the curve 502 rises from a false logic level (e.g., around 0 V in one or more embodiments) to a true logic level (e.g., around 1.5 V in one or more embodiments). Assertion of the lock signal LCK causes the multiplexer 118 to change the output signal OUT of the oscillator circuitry from the fast start-up clock signal CLK_FAST to the VCO clock signal CLK_VCO. Assertion of the lock signal LCK additionally disables the fast start-up oscillator 102 (as well as other components such as the PFD 104, the charge pump 106, and the lock detector 108), such that the fast start-up clock signal CLK_FAST, as shown by the curve 504, is cut off at around 10.5 μs. In one or more embodiments, the lock signal LCK may be held high (e.g., using a D flip flop as a non-limiting example) for as long as the oscillator circuitry 100 remains on after initial assertion of the lock signal LCK.

Figure 6:
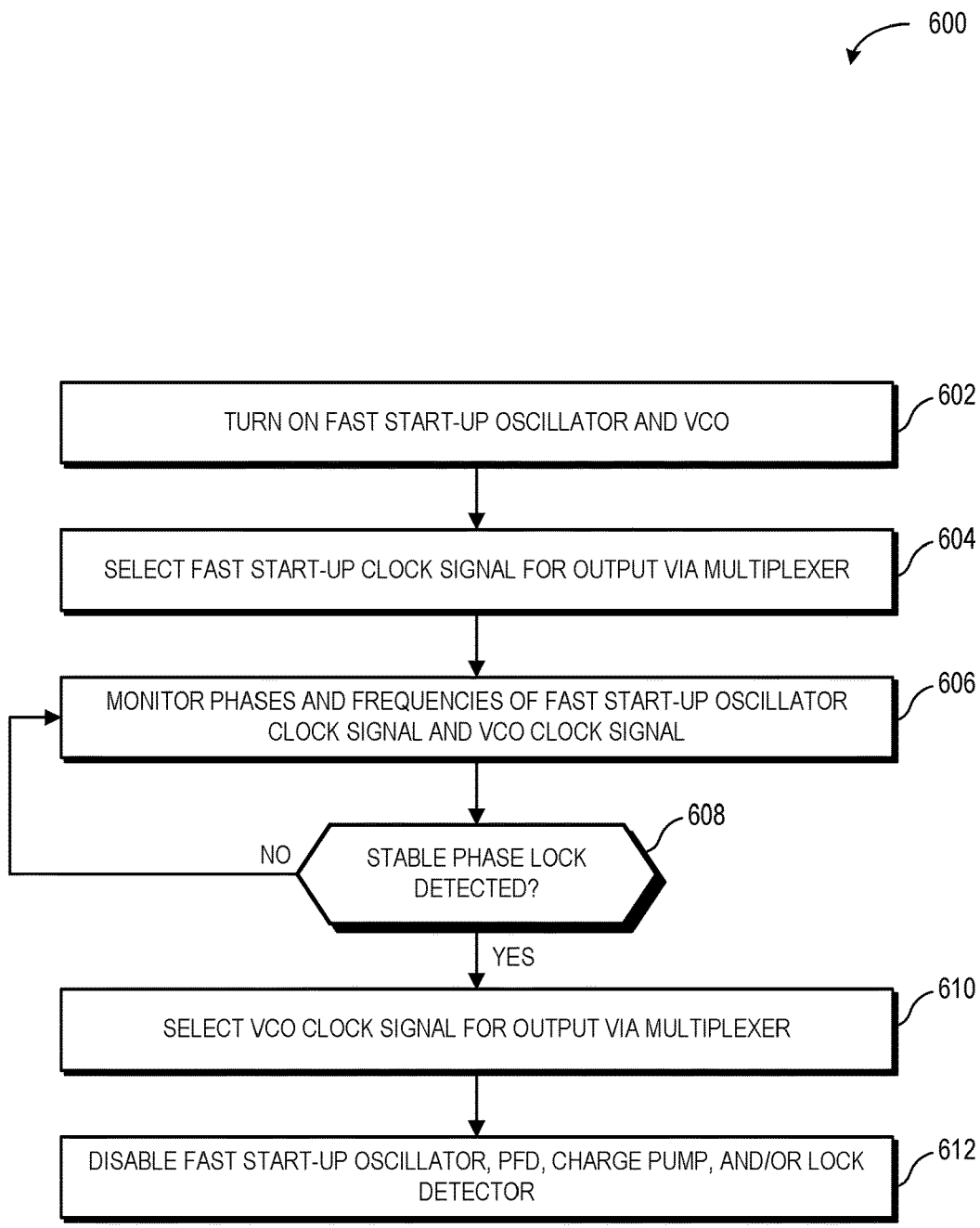
FIG. 6 is a process flow for a method by which oscillator circuitry, such as the oscillator circuitry of FIG. 1, may selectively output one of a fast start-up oscillator clock signal and a VCO clock signal based on whether a stable phase lock is detected between these clock signals, in accordance with one or more embodiments.

FIG. 6 shows an illustrative process flow for a method 600 by which oscillator circuitry may dynamically switch from outputting a first clock signal generated by a fast start-up oscillator and to a second clock signal generated by a relaxation oscillator in response to detecting a stable phase lock between the first frequency signal and the second frequency signal. The method 600 is described with reference to elements of the oscillator circuitry 100 of FIG. 1. It should be understood that reference to the oscillator circuitry 100 is intended to be illustrative and not limiting, such that other suitable oscillator circuitry may be used to carry out the method 600 in one or more other embodiments.

At block 602, the oscillator circuitry 100 is activated (e.g., by a computer processor coupled thereto asserting one or more enable signals provided to elements of the oscillator circuitry 100, as a non-limiting example), such that at least the fast start-up oscillator 102 and the VCO 110 are turned on. Upon being turned on, the fast start-up oscillator 102 may generate a fast start-up clock signal CLK_FAST and the VCO 110 may generate a VCO clock signal CLK_VCO.

At block 604, the oscillator circuitry 100 may select a fast start-up clock signal output (e.g., as the output signal OUT) by the fast start-up oscillator 102 to be output by the oscillator circuitry 100 via the multiplexer 118. For example, the oscillator circuitry 100 may select the fast start-up clock signal CLK_FAST as the output of the multiplexer 118 based on the voltage level of the lock signal LCK output by the lock detector 108 being low, indicating that a stable phase lock has not been detected between the fast start-up clock signal CLK_FAST and the VCO clock signal CLK_VCO. In one or more embodiments, detection of a stable phase lock between CLK_FAST and CLK_VCO may be performed, at least in part, by the lock detector 108 using logic circuitry (e.g., logic circuitry 202 of FIG. 2) and counter circuitry (e.g., counter circuitry 204 of FIG. 2) of the lock detector 108 based on the PFD signals PFD_UP and PFD_DOWN produced by the PFD 104, as described above. In one or more embodiments, the selection of the output of the multiplexer 118 at block 604 may be performed concurrently with block 602.

At block 606, the PFD 104 monitors the phases and frequencies of the clock signals CLK_VCO and CLK_FAST by detecting edges (e.g., leading or trailing edges) of these clock signals and asserting corresponding ones of the PFD signals PFD_DOWN and PFD_UP in response to detecting edges of the respective clock signals. The PFD 104 may be configured to reset the PFD signals PFD_UP and PFD_DOWN to be low in response to detecting that both of these signals are high. In this way, as the phases and frequencies of the clock signals CLK_VCO and CLK_FAST become increasingly aligned, the length of continuous time periods in which either of the signals PFD_UP or PFD_DOWN remains asserted decreases.

At block 608, the lock detector 108 determines whether a stable phase lock between the clock signals CLK_FAST and CLK_VCO is detected. In one or more embodiments, the lock detector 108 determines whether the stable phase lock has occurred based, at least in part, on the PFD signals PFD_UP and PFD_DOWN. In one or more embodiments, the lock detector 108 may detect whether a stable phase lock has been achieved using logic circuitry (e.g., logic circuitry 202 of FIG. 2) and counter circuitry (e.g., counter circuitry 204 of FIG. 2), as described above. If the lock detector 108 detects a stable phase lock, the lock detector asserts the lock signal LCK and the method 600 proceeds to block 610. Otherwise, the method 600 returns to block 606 at which the PFD 104 continues monitor the phases and frequencies of the clock signals CLK_FAST and CLK_VCO.

At block 610, the lock detector 108 provides the asserted lock signal LCK to the control input of the multiplexer 118, causing the multiplexer 118 to select the VCO clock signal CLK_VCO as the output signal OUT. In this way, the output signal OUT of the oscillator circuitry 100 is the clock signal CLK_FAST prior to settling of the VCO 110 and is changed to the VCO clock signal CLK_VCO once the oscillation of CLK_VCO had sufficient time to settle (e.g., determined by the lock detector 108 based on whether a stable phase lock has been detected between CLK_FAST and CLK_VCO).

At block 612, the lock detector 108 disables the fast start-up oscillator 102, the PFD 104, the charge pump 106, and/or the lock detector 108. For example, the lock detector 108 may output the lock signal LCK (e.g., set high) to one or more of the fast start-up oscillator 102, the PFD 104, the charge pump 106, and the logic circuitry of the lock detector 108. The lock signal LCK, when high, may disable any or each of the fast start-up oscillator 102, the PFD 104, the charge pump 106, and the lock detector 108 by preventing either power or input signals from being supplied to these components. For example, the lock signal LCK, when high, may cause the counter circuitry of the lock detector 108 to remain in a reset state. As another example, the asserted lock signal LCK may create an open circuit at the output of the charge pump 106. By disabling one or more of the fast start-up oscillator 102, the PFD 104, the charge pump 106, and the lock detector 108, current consumption of the disabled components may be reduced or eliminated. In this way, the oscillator circuitry 100 may reduce its total power consumption after the oscillation of the VCO clock signal CLK_VCO has stabilized.

In one or more embodiments, the selection of the VCO clock signal CLK_VCO for output via the multiplexer 118 at block 610 and the disabling of the fast start-up oscillator 102, the PFD 104, the charge pump 106, and the lock detector 108 at block 612 may be performed concurrently (e.g., in response to assertion of the lock signal LCK).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in one or more embodiments of the depicted subject matter.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments described herein may be implemented entirely in hardware or in an implementation containing both hardware and software elements. In embodiments which use software, the software may include but is not limited to firmware, resident software, microcode, etc.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. Oscillator circuitry comprising:
   a first oscillator configured to generate a first clock signal;
   a second oscillator configured to generate a second clock signal; and
   a lock detector configured to:
   detect a stable phase lock between the first clock signal and the second clock signal; and
   switch an output of the oscillator circuitry from the first clock signal to the second clock signal in response to detecting the stable phase lock.

2. The oscillator circuitry of claim 1, further comprising:
   a phase-locked loop (PLL) comprising:
   the first oscillator;
   the second oscillator;

a phase frequency detector configured to:
  receive the first clock signal and the second clock signal;
  detect edges of the first clock signal and the second clock signal;
  assert a first signal in response to detecting an edge of the first clock signal;
  assert a second signal in response to detecting an edge of the second clock signal; and
  reset the first signal and the second signal in response to determining that the first signal and the second signal are simultaneously asserted; and
a charge pump configured to modify a control signal received by the second oscillator based on the first signal and the second signal.

3. The oscillator circuitry of claim 2, further comprising:
a frequency-locked loop comprising:
  the second oscillator;
  a frequency-to-voltage circuit configured to:
    receive the second clock signal; and
    generate a voltage based on a frequency of the second clock signal; and
  an operational amplifier configured to:
    receive the voltage and a reference voltage from the frequency-to-voltage circuit;
    compare the voltage and the reference voltage; and
    modify the control signal based on a result of comparing the voltage and the reference voltage.

4. The oscillator circuitry of claim 3, wherein the lock detector is configured to assert a lock signal in response to detecting the stable phase lock.

5. The oscillator circuitry of claim 4, wherein a first output of the frequency-to-voltage circuit is shorted to a second output of the frequency-to-voltage circuit in response to the lock signal not being asserted.

6. The oscillator circuitry of claim 4, further comprising:
a multiplexer configured to receive the first clock signal, the second clock signal, and the lock signal, wherein the multiplexer is configured to:
  output the first clock signal in response to the lock signal not being asserted; and
  output the second clock signal in response to the lock signal being asserted.

7. The oscillator circuitry of claim 4, wherein the lock detector is configured to:
  receive the first signal and the second signal from the phase frequency detector; and
  detect the stable phase lock based on the first signal and the second signal.

8. The oscillator circuitry of claim 7, wherein the lock detector comprises:
  logic circuitry configured to generate a reset signal based on the first signal and the second signal; and
  counter circuitry configured to:
    increment a counter at each cycle of the first clock signal until reset by the reset signal or until the counter reaches a predetermined count value; and
    assert the lock signal in response to the counter reaching the predetermined count value.

9. The oscillator circuitry of claim 4, wherein assertion of the lock signal disables any of the first oscillator, the phase frequency detector, the charge pump, and the lock detector.

10. The oscillator circuitry of claim 4, further comprising:
a compensation capacitor coupled to an input of the second oscillator at which the control signal is received, wherein a voltage at the compensation capacitor is the control signal.

11. The oscillator circuitry of claim 10, further comprising:
a voltage buffer coupled to an output of the charge pump, wherein the output of the charge pump is coupled to the input of the second oscillator; and
an additional compensation capacitor coupled to the voltage buffer, wherein a voltage at the additional compensation capacitor is the control voltage while the PLL is active.

12. A method operating oscillator circuitry, the method comprising:
generating, by a first oscillator of the oscillator circuitry, a first clock signal;
generating, by a second oscillator of the oscillator circuitry, a second clock signal;
detecting, by a lock detector, a stable phase lock between the first clock signal and the second clock signal; and
switching an output of the oscillator circuitry from the first clock signal to the second clock signal in response to detecting the stable phase lock.

13. The method of claim 12, wherein first oscillator has a start-up time of less than 1 nanosecond and the second oscillator has a start-up time of more than 5 microseconds.

14. The method of claim 12, further comprising:
receiving, by a phase frequency detector of the oscillator circuitry, the first clock signal and the second clock signal;
detecting, by the phase frequency detector, edges of the first clock signal and the second clock signal;
asserting, by the phase frequency detector, a first signal in response to detecting an edge of the first clock signal;
asserting, by the phase frequency detector, a second signal in response to detecting an edge of the second clock signal;
resetting, by the phase frequency detector, the first signal and the second signal in response to determining that the first signal and the second signal are simultaneously asserted; and
modifying, by a charge pump of the oscillator circuitry, a control signal received by the second oscillator based on the first signal and the second signal.

15. The method of claim 14, further comprising:
receiving, by a frequency-to-voltage circuit of the oscillator circuitry, the second clock signal;
generating, by the frequency-to-voltage circuit, a voltage based on the frequency of the second clock signal;
receiving, by an operational amplifier of the oscillator circuitry, the voltage and a reference voltage from the frequency-to-voltage circuit;
comparing, by the operational amplifier, the voltage and the reference voltage; and
modifying, by the operational amplifier, the control signal based on a result of comparing the voltage and the reference voltage.

16. The method of claim 15, further comprising:
asserting, by the lock detector, a lock signal in response to detecting the stable phase lock;
outputting, by the oscillator circuitry, the first clock signal in response to the lock signal not being asserted; and
outputting, by the oscillator circuitry, the second clock signal in response to the lock signal being asserted.

17. The method of claim 16, further comprising:
shorting a first output of the frequency-to-voltage circuit to a second output of the frequency-to-voltage circuit in response to the lock signal not being asserted.

18. The method of claim 15, further comprising:
receiving, by the lock detector, the first signal and the second signal from the phase frequency detector; and
detecting, by the lock detector, the stable phase lock based on the first signal and the second signal.

19. The method of claim 18, further comprising:
periodically changing, by counter circuitry of the lock detector, a value of a counter in response to the stable phase lock; and
asserting, by the lock detector, the lock signal in response to the counter of the counter circuitry reaching a predetermined count value.

20. The method of claim 15, further comprising:
disabling any of the first oscillator, the phase frequency detector, the charge pump, and the lock detector in response to assertion of the lock signal.

* * * * *